United States Patent
Nakayama

[11] Patent Number: 5,991,320
[45] Date of Patent: Nov. 23, 1999

[54] LIGHT EMITTING ELEMENT DRIVE APPARATUS

[75] Inventor: Toshiki Nakayama, Atsugi, Japan

[73] Assignee: Canon Kabushiki Kaisha, Tokyo, Japan

[21] Appl. No.: 09/238,173

[22] Filed: Jan. 28, 1999

[30] Foreign Application Priority Data

Jan. 30, 1998 [JP] Japan .................................. 10-018809

[51] Int. Cl.$^6$ ........................................................ H01S 3/00
[52] U.S. Cl. ................................................................ 372/38
[58] Field of Search .................................... 372/38, 29, 8

[56] References Cited

U.S. PATENT DOCUMENTS

| | | | |
|---|---|---|---|
| 5,373,518 | 12/1994 | Uchiyama et al. | 372/38 |
| 5,675,599 | 10/1997 | Abe et al. | 372/38 |
| 5,736,844 | 4/1998 | Yanagisawa | 372/38 |
| 5,796,767 | 8/1998 | Aizawa | 372/38 |

*Primary Examiner*—Leon Scott, Jr.
*Attorney, Agent, or Firm*—Fitzpatrick, Cella, Harper & Scinto

[57] ABSTRACT

A light emitting element drive apparatus includes a differential signal processing circuit for performing logic processing of input complementary image signals that are 180° out of phase and at least one control signal using a differential circuit while maintaining the complementarity of signals to generate complementary output signals, and a switching circuit which is driven by the complementary output signals to supply a drive current to a light emitting element.

8 Claims, 8 Drawing Sheets

LIGHT EMITTING ELEMENT DRIVE APPARATUS

BACKGROUND OF THE INVENTION

1. Field of the Invention

The present invention relates to a drive apparatus for a light emitting element (e.g., a semiconductor laser) used as a recording light source in an image forming apparatus or the like.

2. Related Background Art

The applicant of the basic application filed in Japan has proposed such a light emitting element drive apparatus in Japanese Laid-Open Patent Application No. 8-56034. This drive circuit turns on/off by switching the differential circuit using bipolar transistors. FIG. 1 shows the drive circuit of this prior art. Referring to FIG. 1, this circuit comprises differentially connected npn transistors 101 and 102, an insulating-gate-type NMOS transistor 103 which has a drain connected to the common emitter of the npn transistors 101 and 102 and performs constant current operation, and a semiconductor light emitting element 104 having a cathode connected to the collector of the transistor 101 through a parasitic inductance 106 of the line.

As the semiconductor light emitting element 104, a semiconductor laser or the like is used. A latent image is formed on a photosensitive medium (not shown) by turning on/off this light emitting element in accordance with image data. This circuit also has a load resistor 105 connected to the collector of the transistor 102, a parasitic inductance 107 of the line between the anode of the semiconductor light emitting element 104 and a power supply 115 as a high-potential reference voltage source, a junction capacitance 108 ($C_j$) of the semiconductor light emitting element 104, emitter-collector capacitances 109 and 110 of the transistors 101 and 102, and a drain-gate capacitance 111 of the NMOS transistor 103 which operates as a constant current source.

One terminal of a resistor 112 is connected to the gate of the NMOS transistor 103 and one terminal of a capacitance 113. The other terminal of the resistor 112 is connected to the gate and drain of an NMOS transistor 114. The other terminal of the capacitance 113 is connected to a ground potential 116 as a low-potential reference voltage source. Inverters 117 and 118 supply complementary switching signals 121 and 122 to the bases of the differentially connected transistors, respectively. A constant current source 119 supplies a constant current to the NMOS transistor 114. Data 120 turns on/off the light emitting element.

The input data 120 is converted into the complementary signals 121 and 122 by the inverters 117 and 118 and supplied to the bases of the transistors 101 and 102. By switching the differential circuit comprised of the transistors 101 and 102 in accordance with the input data, the drain current from the NMOS transistor 103 as a constant current source is supplied to the light emitting element 104 or stopped.

The drive circuit shown in FIG. 1 is used for the engine of an LBP (Laser Beam Printer) or the like. In this case, the input data 120 corresponds to image data supplied to the printer. When the image data 120 is at high level, the light emitting element is turned off. When the image data 120 is at low level, the light emitting element is turned on. In FIG. 1, the NMOS transistor 103 is used as a constant current source to obtain a current pulse free from ringing or overshoot.

The applicant of the basic application filed in Japan has also proposed an image forming apparatus using the electrophotography process in Japanese Laid-Open Patent Application No. 8-46273. The image forming apparatus of this prior art will be described with reference to FIGS. 2A and 2B. Referring to FIG. 2A, this apparatus comprises a semiconductor laser drive circuit 201, a semiconductor laser control IC 202, a semiconductor laser diode (to be referred to as an LD hereinafter) 206, and a photodiode (to be referred to as a PD hereinafter) 207. This apparatus also has a sequence controller 203 for driving the image forming apparatus and controlling the electrophotography process, a CPU 204 of the sequence controller 203, an image controller 205 for converting character data from the host computer into dot data, a power supply line 214, and a ground line 213.

The semiconductor laser drive circuit 201 is integrated as the control IC 202. The control IC 202 has an arrangement shown in FIG. 2B. High-frequency band closed loop characteristics are realized by amplifiers 250 and 251. The light emitting amount of the LD 206 is controlled to a light amount designated by a light amount control signal 211 from the sequence controller 203 in units of pulses of an image signal. When a forced lighting signal 212 or an image signal 210 is active low, a drive current is supplied to the LD 206 through an AND circuit 253 and the amplifier 250. When the LD 206 emits light, a photocurrent flows to the PD 207. The amplifier 251 compares the set value output from a data conversion circuit 252 on the basis of the light amount control signal 211 from the CPU 204 with the photocurrent to the PD 207 and controls the light emitting amount of the LD 206 to the target light amount.

FIG. 3 shows signals at various sections of the circuit shown in FIG. 2A. A paper sheet 230 has a printing area 231. The image signal 210 is turned on/off in the printing area 231 in accordance with a horizontal synchronizing signal to form a latent image on a photosensitive medium. At this time, the light amount control signal 211 is set at a predetermined voltage (voltage value at which the light emitting amount of the LD 206 has a desired value). The light amount of the LD 206 can be changed by changing the value of the light amount control signal 211. In this case, as the voltage of the light amount control signal 211 becomes low, the light emitting amount of the LD 206 becomes large. To lower the resolution or increase the image density, the value of the light amount control signal 211 is set to be smaller. Outside the printing area 231, the light amount control signal 211 is turned off (high level) and used as a mask signal for the image signal 210. Hence, even when the image controller 205 turns on the image signal 210 outside the printing area 231, the LD 206 is prevented from emitting light.

In the image forming apparatus, the motor and optical system including the semiconductor laser are driven as a preprocess for printing. At this time, the sequence controller 203 turns on (low) the forced lighting signal 212 to forcibly turn on the LD 206 independently of image input, thereby testing the operation of the optical system including the LD 206. When the forced lighting signal 212 is to be turned on, the light amount control signal 211 must be set at predetermined value. In the image forming apparatus having the above arrangement, the horizontal synchronizing signal (BD signal) used as a synchronizing signal of each line is obtained by causing the LD 206 to emit light before the printing area 231 and detecting the laser beam with a sensor (BD sensor) set at a predetermined position. In forming the BD signal as well, the forced lighting signal 212 is turned on, and the light amount control signal 211 is set at a predetermined value.

This processing of masking the image signal outside the printing area and forcibly turning on the semiconductor laser diode is performed by the sequence controller 203. Instead, the sequence controller 203 may supply a light amount control signal 211 and forced lighting signal 212 to the semiconductor laser drive circuit 201, so the processing is executed on the semiconductor laser drive circuit 201 side. With this arrangement, the processing load on the sequence controller can be decreased. In addition, since image processing which is normally done by the sequence controller is executed by a versatile gate array or the like, degradation in pulse width reproducibility of the image signal from the image controller can be prevented.

FIG. 4 shows a two-input NOR circuit using a general ECL (Emitter Coupled Logic). A differential circuit is formed by a pair of npn transistors 301 and 302 and an npn transistor 303. The circuit has a constant current source 304 for supplying a constant current to the differential circuit, resistors 305 and 306 as the load of the differential circuit, a power supply line 308, and a ground line 307. Complementary outputs 309 and 310 from the differential circuit are connected to the input terminals (base electrodes of npn transistors 311 and 312) of a level shift circuit comprising the npn transistors 311 and 312 and constant current sources 313 and 314. This level shift circuit adjusts the DC level of the output from the NOR circuit to the input range of the subsequent stage. Outputs 315 and 316 from the level shift circuit are complementary outputs from the NOR circuit. Inputs 317 and 318 to the NOR circuit are input to the bases of the npn transistors 301 and 302, respectively. A reference voltage 319 is used to determine high or low level of the inputs 317 and 318 and input to the base to the npn transistor 303.

In the circuit shown in FIG. 4, when at least one of the inputs 317 and 318 is larger (higher) than the reference voltage, at least a corresponding one of the transistors 301 and 302 is turned on, and the transistor 303 is turned off. Hence, the constant current from the constant current source 304 flows to the load resistor 305, and the output 309 from the differential circuit and the output 315 from the NOR circuit go low. To the contrary, no current flows to the resistor 306. The output 310 from the differential circuit equals the power supply voltage, and the output 316 from the NOR circuit goes high, so an output signal complementary to the output 315 is output.

On the other hand, when both the inputs 317 and 318 are smaller than the reference voltage, both the transistors 301 and 302 are turned off, and the transistor 303 is turned on. The current from the constant current source 304 flows to the load resistor 306, and the output 310 from the differential circuit and the output 316 from the NOR circuit go low. To the contrary, no current flows to the resistor 305. The output 310 from the differential circuit equals the power supply voltage, and the output 315 from the NOR circuit goes high, so an output signal complementary to the output 316 is output. As described above, the circuit shown in FIG. 4 operates as a NOR circuit (output 315) or an OR circuit (output 316) for receiving the signals 317 and 318. By selecting the load resistor and the constant current value so the transistors operate in the nonsaturation region, a circuit arrangement allowing high-speed operation and suitable for high-speed signal processing is realized.

For current print systems using laser beam printers, image or photograph output, higher-speed processing, and higher resolution are increasingly required. For a laser diode, a switching speed of several ten MHz to several hundred MHz is required. Additionally, to realize a higher image quality, it is essential to obtain high reproducibility of output pulse width of a laser diode. The scheme of controlling the current to the light emitting element by switching operation of the differential circuit using bipolar transistors shown in FIG. 1 is advantageous for high-speed processing. However, this circuit poses the following problems because a single image signal is received by the control IC, and complementary input signals to the differential circuit are generated in the control IC using inverters.

As the first problem, when a single image signal is converted into the complementary signals 121 and 122 using the inverters 117 and 118 and input to the differential circuit formed by the transistors 101 and 102, a delay difference is generated between the two signals because the signal 122 passes through the second inverter 118, so the output pulse width of the laser diode shifts from the original image signal. More specifically, both the signals 121 and 122 temporarily go high or low due to the delay difference. During this time, the current from the constant power supply 111 nearly equally flows to the transistors 101 and 102. The current flowing to the light emitting element is ½ the predetermined amount and cannot reach the threshold current for light emission. During this time, no light emission occurs, and the light pulse width becomes small. This appears as a line width difference (decrease) in output from the LBP. The delay time per inverter is several tenth to one nsec. This poses no problem when the speed or resolution is low. However, when an operation speed of several ten MHz to several hundred MHz is required, the delay poses a serious problem.

The second problem is noise. Use of a single image signal is disadvantageous because RF noise is generated on a substrate on which a control IC is mounted or a semiconductor substrate on which a light emitting element drive circuit is integrated as the operation speed becomes higher. As a high-speed logic circuit, the ECL circuit shown in FIG. 4 can be used. However, complementary inputs cannot be processed except when the circuit is used as an inverter. To perform signal processing as shown in FIGS. 2A and 3, the image signal must be temporarily converted into a single output and processed, and then complementary signals must be generated again. In this case, however, the initial purpose of obtaining a noise-free signal by transmitting complementary signals cannot be achieved. In addition, the circuit scale becomes large to result in an increase in cost.

SUMMARY OF THE INVENTION

The present invention has been made in consideration of the above situation, and has as its object to provide a light emitting element drive apparatus which has excellent reproducibility of light output pulse width of a light emitting element and is less influenced by noise.

The object of the present invention is achieved by a light emitting element drive apparatus comprising a differential signal processing circuit for performing logic processing of input complementary image signals that are 180° out of phase and at least one control signal using a differential circuit while maintaining the complementarity of signals to generate complementary output signals, and a switching circuit driven by the complementary output signals to supply a drive current to a light emitting element.

DESCRIPTION OF THE PREFERRED EMBODIMENTS

Figure 5:
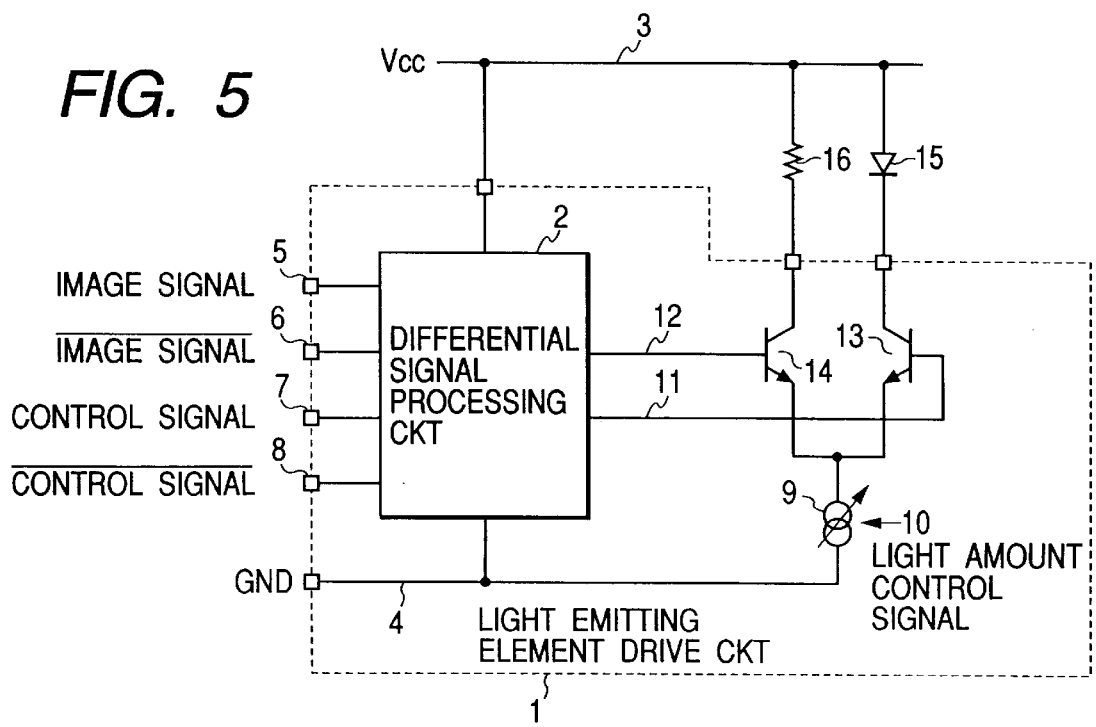
FIG. 5 is a block diagram showing the arrangement of a light emitting element drive apparatus according to the first embodiment of the present invention.

The embodiments of the present invention will be described below in detail with reference to the accompanying drawings. FIG. 5 is a circuit diagram showing the arrangement of a light emitting element drive apparatus according to the first embodiment of the present invention, which is used for an image forming apparatus. Referring to FIG. 5, a light emitting element drive apparatus 1 comprises a differential signal processing circuit 2, a switching circuit having transistors 13 and 14, and a constant current source 9. As a light emitting element 15 to be driven, a semiconductor laser or the like is used. This semiconductor laser diode is driven and turned on/off in accordance with an image signal to form a latent image on a photosensitive drum (not shown) as a recording medium.

The differential signal processing circuit 2 receives complementary image signals 5 and 6 from the image controller of the image forming apparatus and complementary control signals 7 and 8 from the CPU of the image forming apparatus and performs logic calculation to generate output signals 11 and 12 as drive signals to the npn transistors 13 and 14 of the switching circuit. The arrangement of the differential signal processing circuit 2 will be described later in detail. The constant current source 9 is connected to the common emitter of the differential circuit formed from the npn transistors 13 and 14 of the switching circuit. The light amount of the light emitting element 15 is controlled to a predetermined amount by controlling the current from the constant current source 9 in accordance with a light amount control signal 10 from an APC (Automatic Power Control) circuit (not shown). The APC circuit detects part of light from the light emitting element 15 and compares the light amount with a reference value corresponding to a desired light amount, thereby controlling the light amount. The apparatus also has a power supply line 3, a ground line 4, and an external resistor 16.

The complementary signals of the present invention are not complementary image signals obtained by processing a single image signal by inverters or the like.

In the present invention, since the complementary image signals 5 and 6 that have an equal amplitude and are 180° out of phase are input to the differential signal processing circuit 2, no delay difference is generated between the two signals.

For this reason, even when differential signal processing is performed, the light output pulse width of the light emitting element 15 does not shift from the original image signal.

Similarly, in the present invention, the complementary control signals 7 and 8 that have an equal amplitude and are 180° out of phase are input to the differential signal processing circuit 2.

Figure 6:
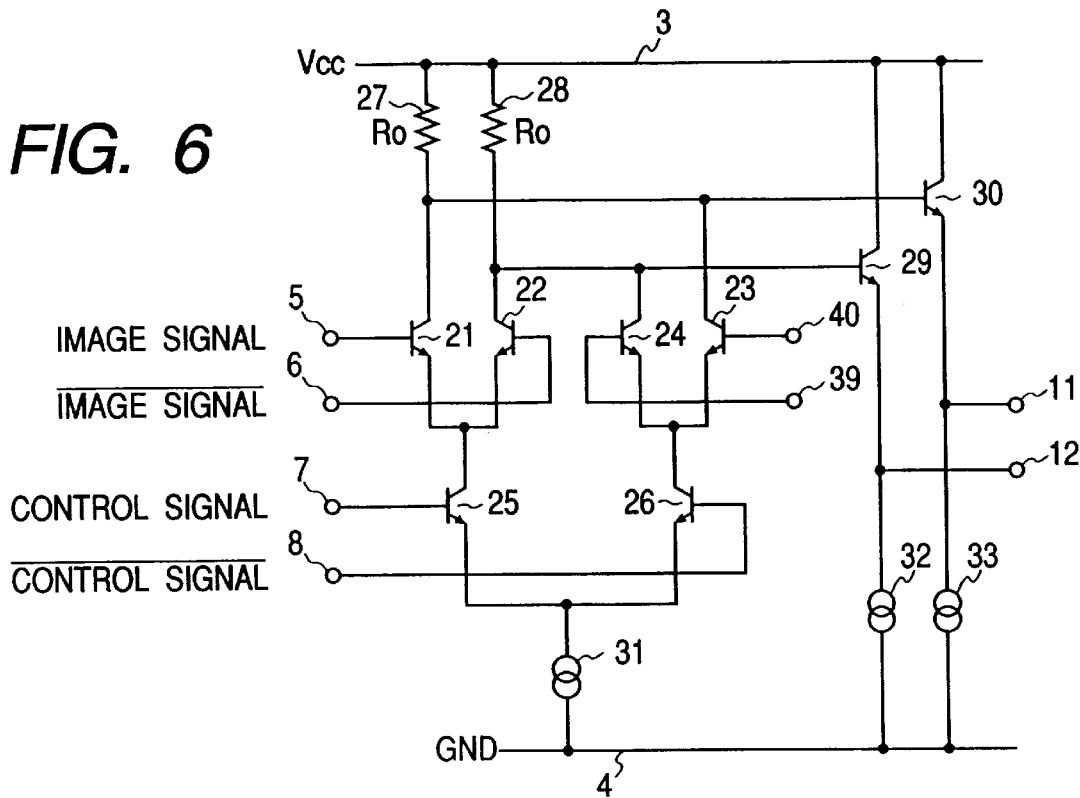
FIG. 6 is a circuit diagram showing details of a differential signal processing circuit shown in FIG. 5.

FIG. 6 is a circuit diagram showing an example of the differential signal processing circuit 2. Referring to FIG. 6, each of pairs of npn transistors 21 and 22, 23 and 24, and 25 and 26 forms a differential circuit. The complementary image signals 5 and 6 are supplied to the base terminals of the transistors 21 and 22, respectively, and the complementary control signals 7 and 8 are supplied to the base terminals of the transistors 25 and 26, respectively. Outputs 40 and 39 from a voltage generation circuit (to be described later) are supplied to the base terminals of the transistors 23 and 24, respectively. The output 39 is larger than the output 40. The common emitter terminal of the transistors 21 and 22 is connected to the collector terminal of the transistor 25. The common emitter terminal of the transistors 23 and 24 is connected to the collector terminal of the transistor 26. The common emitter terminal of the transistors 25 and 26 is connected to a constant current source 31.

The collector terminals of the transistors 21 and 23 are connected to a load resistor 27. The output signals from these collector terminals are supplied to the base terminal of a transistor 30 forming an emitter follower circuit and also serving as a level shifter and an output buffer. The collector terminals of the transistors 22 and 24 are connected to a load resistor 28. The output signals from these collector terminals are supplied to the base terminal of a transistor 29 forming an emitter follower circuit and also serving as a level shifter and an output buffer. The other terminal of each of the load resistors 27 and 28 is connected to the power supply line 3. The emitter terminal of the transistor 29 is connected to a constant current source 32. The drive signal 12 to the switching circuit is output from this emitter terminal. The emitter terminal of the transistor 30 is connected to a constant current source 33. The drive signal 11 to the switching circuit is output from this emitter terminal.

Figure 7:
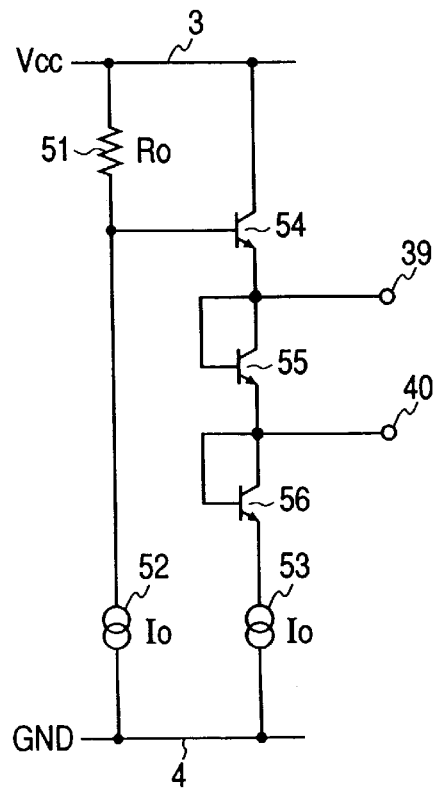
FIG. 7 is a circuit diagram of a voltage generation circuit used for the differential signal processing circuit shown in FIG. 6.

FIG. 7 is a circuit diagram showing an example of the voltage generation circuit. Referring to FIG. 7, constant current sources 52 and 53 have an almost equal current value $I_O$. One terminal of a resistor 51 (resistance value $R_O$) is connected to the power supply line 3, and its other terminal is connected to the constant current source 52 and the base terminal of a transistor 54. The collector terminal of the transistor 54 is connected to the power supply line 3, and its emitter terminal is connected to the C-B short terminal of a transistor 55. The output 39 is output from the emitter terminal of the transistor 54. The emitter terminal of the transistor 55 is connected to the C-B short terminal of a transistor 56. The other output 40 is also output from the emitter terminal of the transistor 55. The emitter terminal of the transistor 56 is connected to the constant current source 53.

As is apparent from the circuit shown in FIG. 7, the output 39 is $V_{CC} - I_O \cdot R_O - V_{BE}$ and the output 40 is $V_{CC} - I_O \cdot R_O - 2V_{BE}$ where $V_{BE}$ is the base-emitter voltage of the transistor 54 or 55. Hence, the output 39 is larger than the output 40. The outputs 39 and 40 are supplied to the base terminals of the npn transistors 24 and 23 forming a differential circuit, respectively. As the control signals 7 and 8, forced lighting signals for turning on the light emitting element independently of the image signals to adjust the light amount or mask signals for masking the image signals, and for turning off the light emitting element 15 independently of the image signals are used. That is, the control signals control light emission of the light emitting element independently of the image signals.

The operation of this embodiment will be described next in detail. The differential signal processing circuit 2 shown in FIG. 6 functions as a NAND/AND circuit or a NOR/OR circuit which receives the complementary image signals 5 and 6 and complementary control signals 7 and 8 (they will be described as forced lighting signals), performs signal processing while maintaining the complementarity of signals by the differential circuit, and outputs the complementary output signals 11 and 12. More specifically, when the control signal 7 is at low level (the control signal 8 is at high level), the transistor 26 is turned on, and the transistor 25 is turned off. The output signals 11 and 12 are determined not by the image signals 5 and 6 but by the signals 39 and 40 supplied from the constant voltage circuit to the base terminals of the transistors 23 and 24, respectively.

Since the signal 39 is always larger than the signal 40, as described above, the transistor 24 is turned on, and the transistor 23 is turned off. A current flows from the load resistor 28 to the transistors 24 and 26, and the base potential of the transistor 29 decreases, so the output 12 goes low. On the other hand, since the transistor 23 is turned off, the base potential of the transistor 30 goes high, so the output 11 goes high. In this case, the transistor 13 of the switching circuit shown in FIG. 5 is turned on. Hence, the light emitting element 15 is turned on independently of the image data 5 and 6.

When the control signal 7 goes high (the control signal 8 goes low), the transistor 25 is turned on, and the transistor 26 is turned off. Hence, the output from the signal processing circuit 2 changes depending on the image signals 5 and 6. More specifically, when the image signal 5 is at low level (the image signal 6 is high level), the transistor 21 is turned off, and the transistor 22 is turned on. A current flows from the load resistor 28 to the transistors 22 and 25, and the base potential of the transistor 29 decreases, so the output 12 goes low. In addition, since the transistor 21 is turned off, the base potential of the transistor 30 goes high, and accordingly the output 11 goes high. When the image signal 5 is at low level, the transistor 13 of the switching circuit is turned on, and the transistor 14 is turned off. For this reason, a drive current is supplied to the light emitting element 15 to initiate light emission.

When the image signal 5 goes high (the image signal 6 goes low), the transistor 21 is turned on, and the transistor 22 is turned off. The base potential of the transistor 29 goes high, and the base potential of the transistor 30 goes low. Hence, the output 11 goes low, and the output 12 goes high. In this case, the transistor 13 of the switching circuit is turned off, and the transistor 14 is turned on, so the light emitting element 15 is turned off. As described above, the differential signal processing circuit 2 performs NAND/AND or OR/NOR logic operation for the complementary input signals, i.e., the image signals 5 and 6 and the control signals 7 and 8 (the NAND of the inputs 5 and 7 is the output 11, and its AND is the output 12. Similarly, the OR of the inputs 6 and 8 is the output 11, and its NOR thereof is the output 12) and supplies the complementary outputs 11 and 12 to the switching circuit connected to the differential signal processing circuit.

As the control signals 7 and 8, not only forced lighting signals for turning on the light emitting element 15 independently of the image signals but also mask signals for turning off the light emitting element 15 independently of the image signals can be used, as described above. In this embodiment, forced lighting signals are used as the control signals, as described above. When the control signal 7 is at low level, the output 11 from the differential signal processing circuit 2 goes high, and the output 12 goes low. By supplying the drive current to the light emitting element 15 independently of the image signals, the light emitting element 15 can be forcibly turned on. When the control signal 7 is set at high level, the outputs 11 and 12 from the differential signal processing circuit 2 change according to the image signals, so the light emitting element 15 can be driven in accordance with the image signals. As described above, the differential signal processing circuit 2 can forcibly turn on the light emitting element in accordance with the control signals or drive it in accordance with the image signals.

In this embodiment, the image signals are processed without conversion to a single signal until the complementary image signals and complementary control signals input to the differential signal processing circuit 2 are subjected logic signal operation to generate drive signals for the switching circuit. For this reason, no shift is generated between the image signals unlike the case wherein the complementary input signals are converted into a single signal (logic processing) and then back to complementary drive signals. Hence, a drive circuit capable of accurately reproducing the light output pulse width of the light emitting element 15 in accordance with the image signal can be realized. Logic operation of the image signals and control signals is done using the differential circuit. For this reason, when the differential signal processing circuit or switching circuit is integrated on a semiconductor substrate or mounted on a mounting substrate, the differential circuit provides an in-phase signal removing function for noise on the semiconductor substrate or mounting substrate, so a drive circuit less influenced by noise than the conventional circuit for processing a single image signal can be realized. In addition, when the image signals, control signals, and output voltage from the voltage generation circuit are set to operate the transistors of the differential signal processing circuit 2 in the nonsaturation region, high-speed operation nearly equivalent to that of an ECL can be realized.

In the above embodiment, the complementary control signals 7 and 8 are used as control signals. However, the control signals need not always be complementary signals because the light output pulse width of the light emitting element 15 depends on the image signals. When complementary control signals are not used, only the control signal 7 is input, and an intermediate voltage of the amplitude of the control signal 7 is input as the other control signal 8. However, complementary control signals are preferably used because a single control signal is disadvantageous in suppressing the influence of noise on the semiconductor substrate or mounting substrate.

Figure 1:
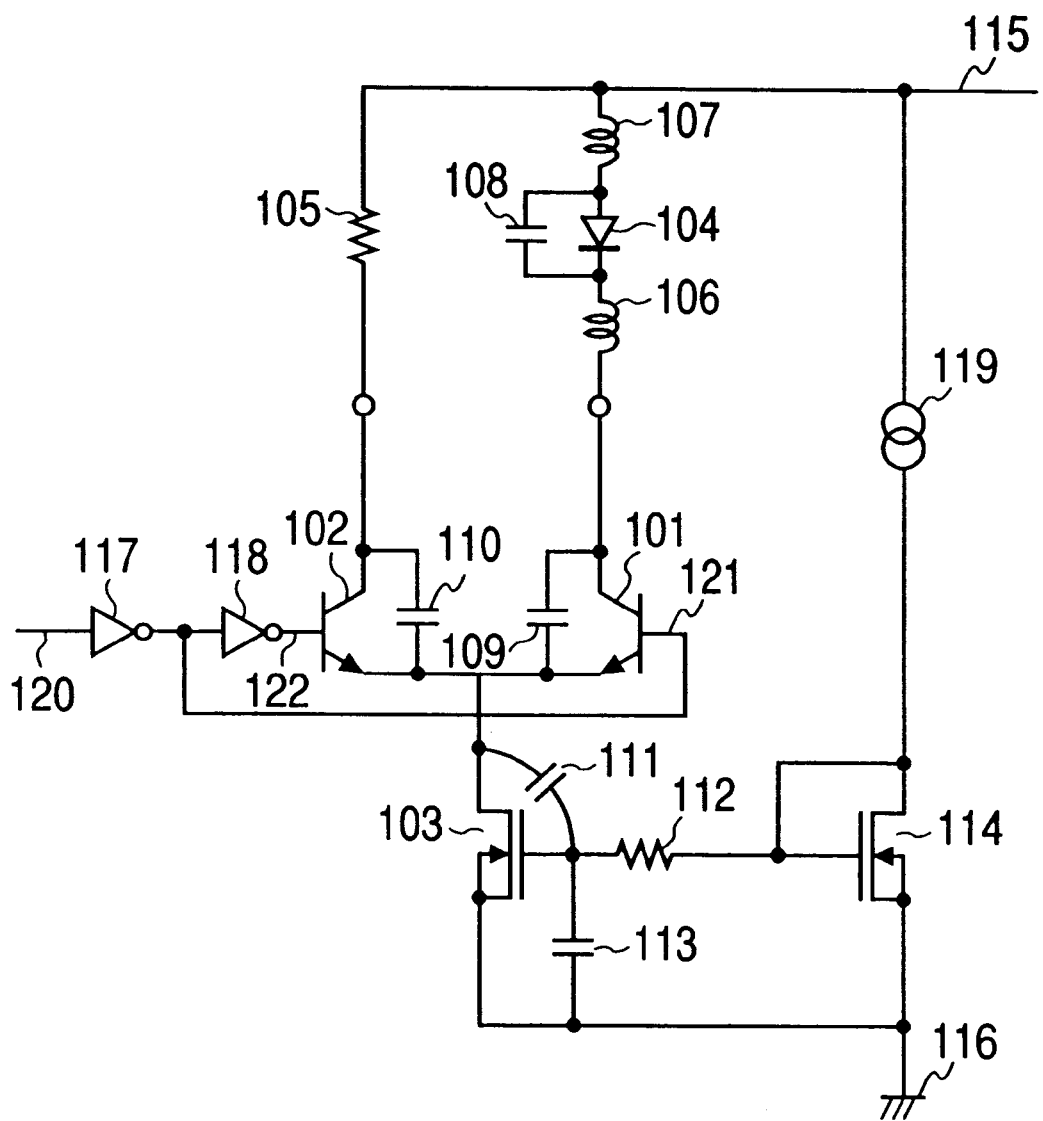
FIG. 1 is a circuit diagram showing a conventional light emitting element drive circuit.
Figure 2A:
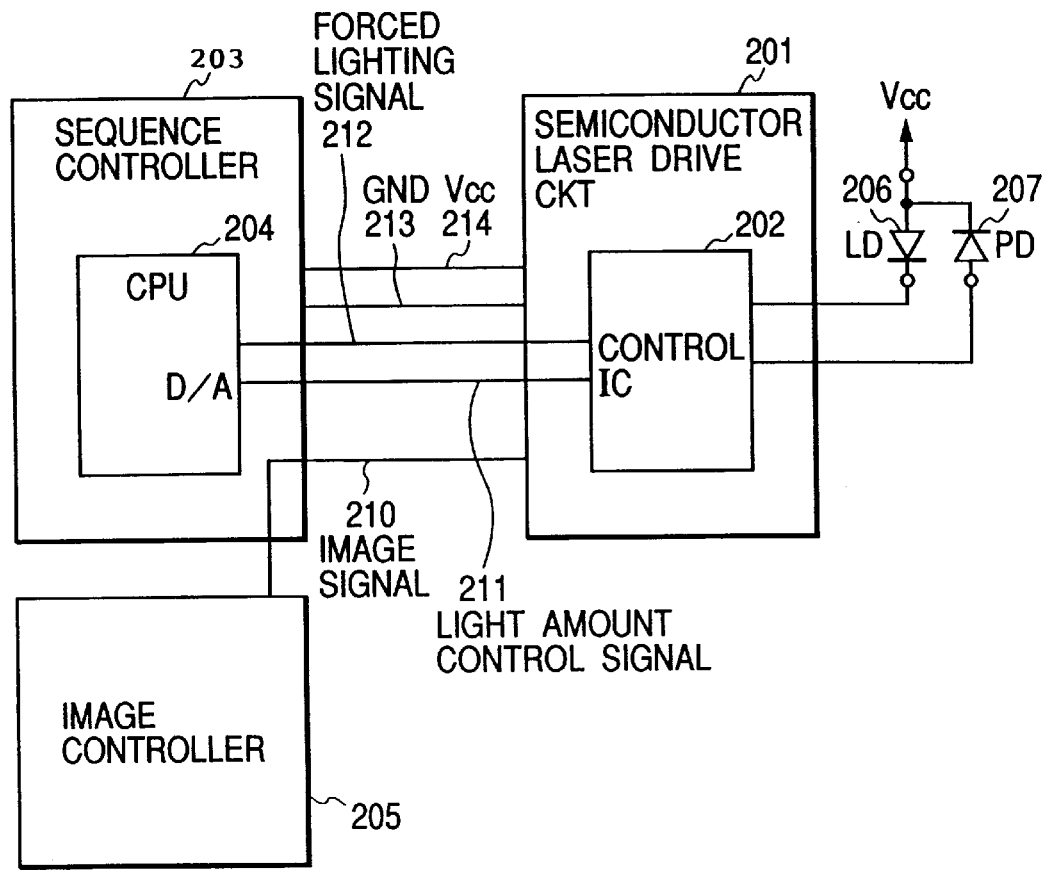
FIG. 2A is a block diagram showing a conventional image forming apparatus.
Figure 2B:
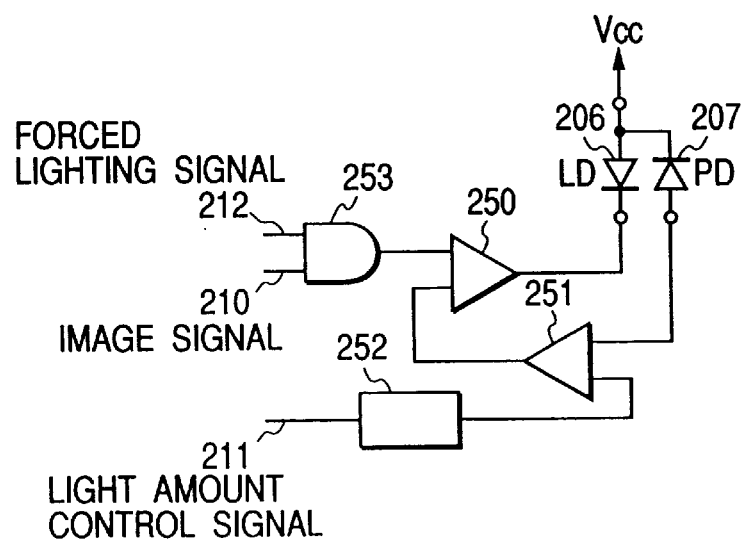
FIG. 2B is a circuit diagram showing the arrangement of a control IC 202.
Figure 3:
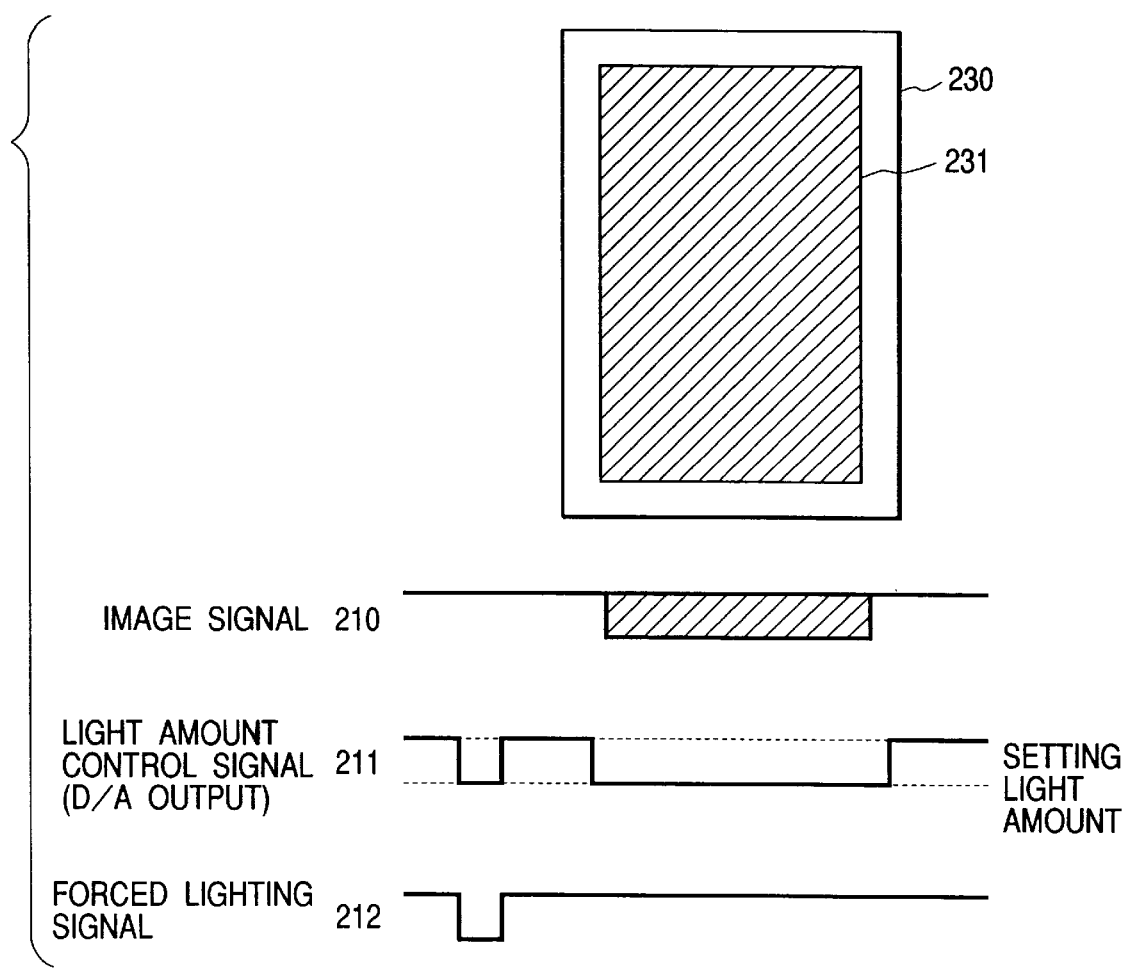
FIG. 3 is a timing chart for explaining the operation of the image forming apparatus shown in FIG. 2A.
Figure 4:
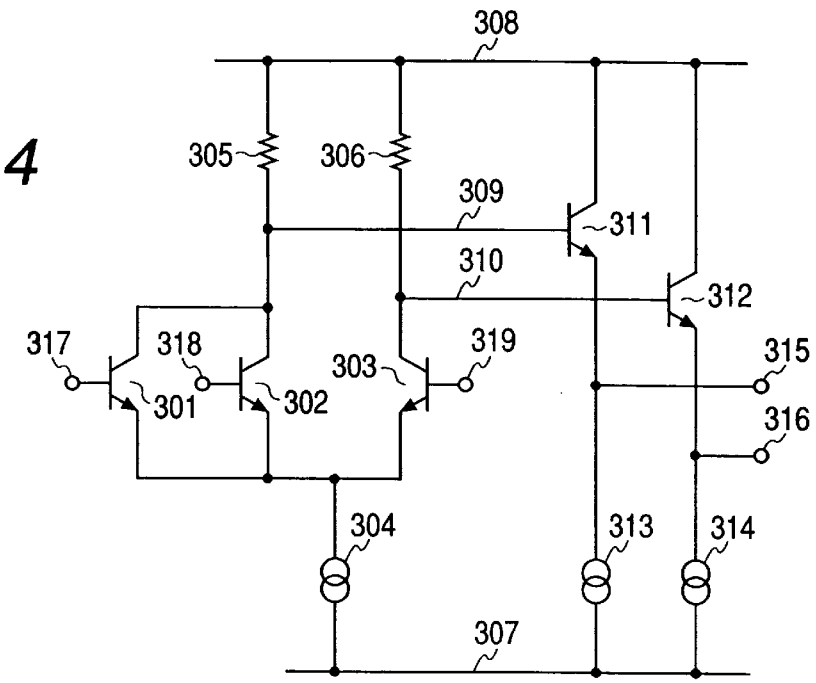
FIG. 4 is a circuit diagram showing a two-input NOR circuit as a general ECL.

The transistor 24 of the differential signal processing circuit 2 need not always be turned off. However, the transistor 24 is preferably inserted because when the parasitic capacitances of the collectors of the transistors 21 and 22 change, the complementarity of the outputs 11 and 12 does not balance. In addition, although the image signals 5 and 6 are input to the transistors 21 and 22, respectively, and the control signals 7 and 8 are input to the transistors 25 and 26, respectively, input of image signals and control signals may be reversed. As the differential signal processing circuit 2, not only the circuit shown in FIG. 6 but also a combination of circuits capable of differentially processing signals can be used. For example, the transistor 302 in the NOR circuit using the ECL shown in FIG. 4 is omitted to form an inverter (or a buffer) operated by complementary signals. When this circuit is combined with the circuit shown in FIG. 6, waveform shaping can be done.

Figure 8:
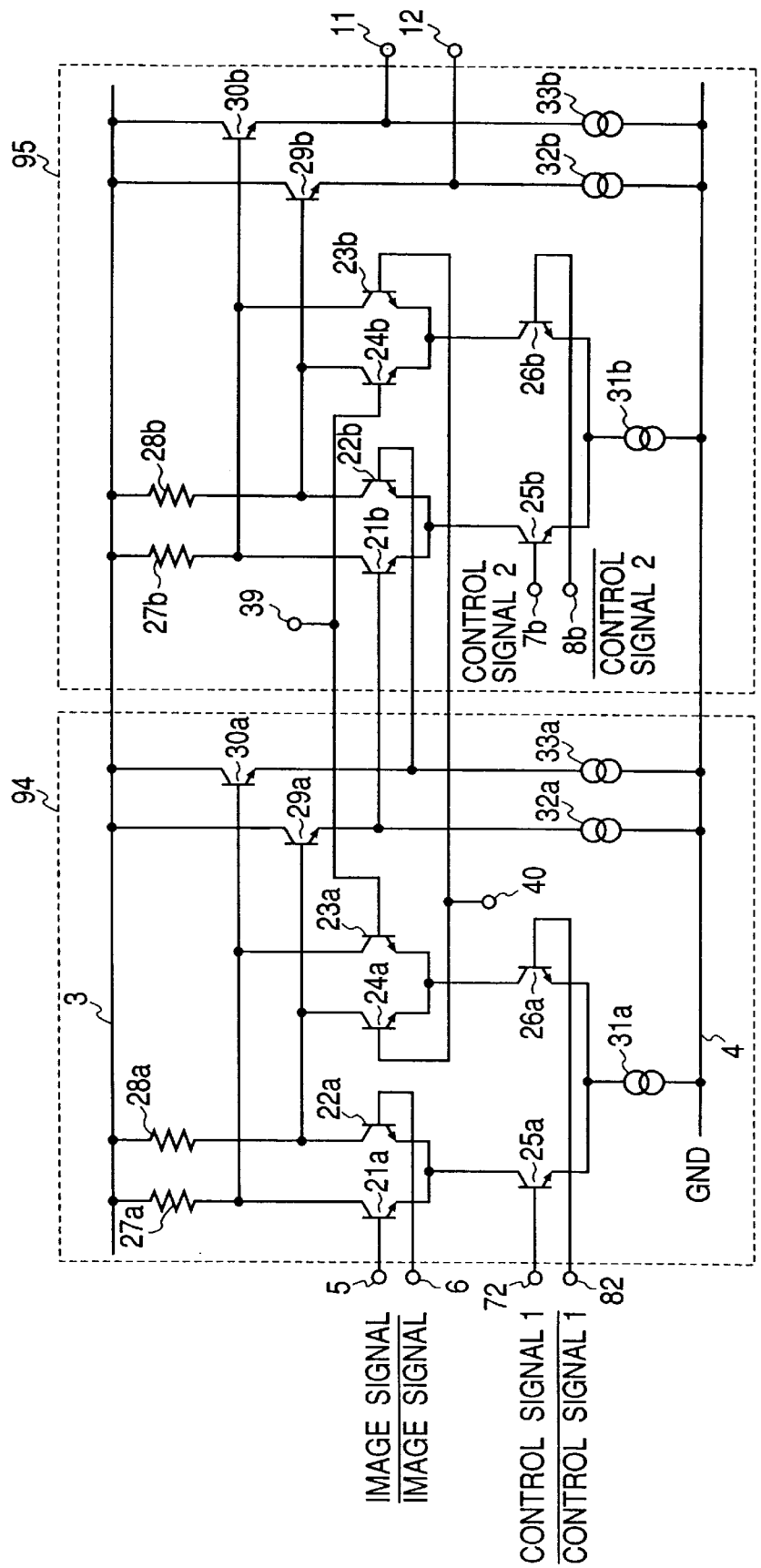
FIG. 8 is a circuit diagram showing another example of the differential signal processing circuit.

Furthermore, logic operation of a plurality of control signals and image signals may be performed by combining differential signal processing circuits. FIG. 8 shows a differential signal processing circuit for performing logic operation of complementary image signals, complementary forced lighting signals, and complementary mask signals. This circuit is constituted by a series circuit of circuits each as shown in FIG. 6. Each logic circuit has essentially the same arrangement as in FIG. 6. The same reference numerals as in FIG. 6 denote the same parts in FIG. 8 (suffices a and b are added to the reference numerals to discriminate elements between the circuits), and a detailed description thereof will be omitted. Only portions different from FIG. 6 will be described.

Assume that a mask signal is used as control signal 1, and a forced lighting signal is used as control signal 2. A second stage 95 of this differential signal processing circuit has the same arrangement as that of the differential signal processing circuit shown in FIG. 6. Hence, when control signal 2 is at low level, the output 11 goes high, and the output 12 goes low independently of inputs to transistors 21b and 22b, and the light emitting element 15 is turned on. When control signal 2 is at high level, the outputs 11 and 12 are determined by the input levels to the transistors 21b and 22b. The mask signal of a first stage 94 of this differential signal processing circuit is effective when control signal 2 is at high level. The operation of the first stage 94 in only this case need be considered.

The first stage 94 of the differential signal processing circuit also has essentially the same arrangement as in FIG. 6 except that the base of a transistor 23a is connected to always be at higher level than that of the base of a transistor 24a. As in FIG. 6, when control signal 1 is at low level, a transistor 26a is turned on, a transistor 25a is turned off, and the outputs are determined independently of the image signals. However, since the transistor 23a is turned on, the emitter potential of a transistor 30a goes low, and the emitter potential of a transistor 29a goes high (when control signal 2 is at high level). These results directly appear as the outputs 11 and 12. For this reason, the light emitting element is turned off independently of the image signals, so the image signals can be masked. When control signal 1 is at high level (and when control signal 2 is high level), high or low level of the output 11 is determined by the image signals 5 and 6, as in FIG. 6.

As described above, when a plurality of differential signal processing circuits are combined to perform logic operation of a plurality of control signals and complementary image signals and control ON/OFF of the switching circuit, the light emitting element can be switched.

In the above embodiment, npn transistors are used for the switching circuit using a differential circuit for supplying a drive current to the light emitting element 15. However, the present invention is not limited to this. For example, NMOS-FETs or n-type jFETs may be used. Alternatively, pnp transistors, PMOSFETs, or p-type jFETs may be used depending on the type of light emitting element. When the differential signal processing circuit and the switching circuit are integrated on a semiconductor substrate, parasitic elements traced back to the mounting substrate or individual components can be reduced, and higher-speed operation can be performed.

Figure 9:
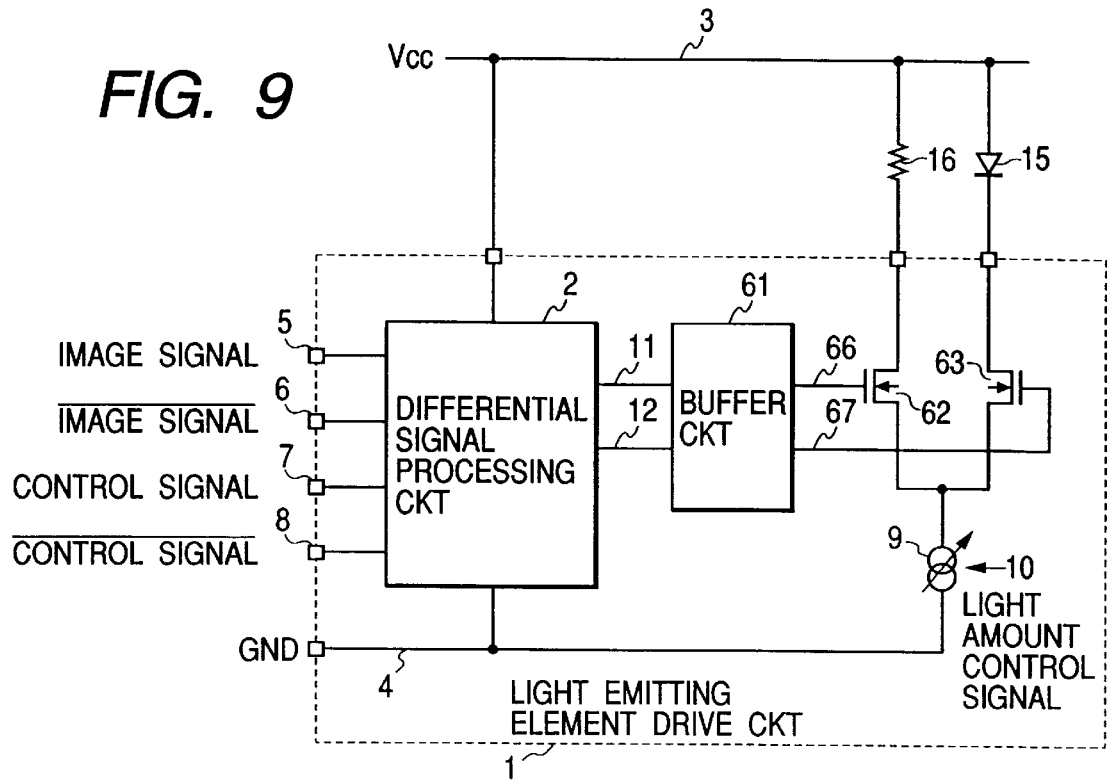
FIG. 9 is a block diagram showing the second embodiment of the present invention.

FIG. 9 is a block diagram showing the second embodiment of the present invention. In this embodiment, a buffer circuit (or an amplitude conversion circuit) 61 is inserted between a differential signal processing circuit 2 and a switching circuit using a differential circuit. The switching circuit is formed by a differential circuit having NMOS transistors 62 and 63. The arrangement of the remaining portions is the same as in FIG. 5. As described above, the differential signal processing circuit 2 shown in FIG. 6 preferably operates the respective differential transistors in a nonsaturation region to keep high operation speed, like an ECL. However, when the transistors are operated in the nonsaturation region, a large output amplitude cannot be obtained. On the other hand, to switch the switching circuit at a high speed, a drive signal having a relatively large amplitude is required. In this embodiment, by inserting the buffer circuit (or an amplitude conversion circuit) 61, a drive signal having a sufficient large amplitude is supplied to the switching circuit even when the output signal from the differential signal processing circuit 2 has a small amplitude.

Figure 10:
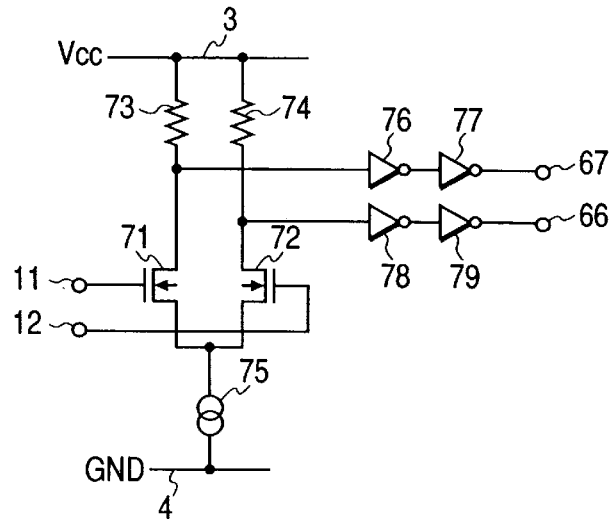
FIG. 10 is a circuit diagram showing details of a buffer circuit of the embodiment shown in FIG. 9.

FIG. 10 shows a specific example of the buffer circuit 61. Referring to FIG. 10, the buffer circuit 61 comprises NMOS-FETs 71 and 72 forming the differential circuit, load resistors 73 and 74, and a constant current source 75. Outputs 11 and 12 from the differential signal processing circuit 2 are connected to the gate terminals of the NMOSFETs 71 and 72, respectively. The drain terminal of the NMOSFET 71 is connected to the input terminal of a CMOS inverter 76. The output terminal of the CMOS inverter 76 is connected to a CMOS inverter 77 having a larger drive capability. The drain terminal of the NMOSFET 72 is connected to the input terminal of a CMOS inverter 78, and the output terminal of the CMOS inverter 78 is connected to a CMOS inverter 79 having a larger drive capability. An output 67 from the CMOS inverter 77 is supplied to the gate terminal of the NMOSFET 63 forming the switching circuit as a drive signal, and an output 66 from the CMOS inverter 79 is supplied to the gate terminal of the NMOSFET 62 as a drive signal.

In this embodiment, the buffer circuit (or amplitude conversion circuit) is inserted between the differential signal processing circuit 2 and the switching circuit. With this arrangement, the drive signals supplied to the switching circuit have a sufficient drive capability. In addition, the amplitude fully swings between the power supply voltage and the ground voltage. Hence, even when the differential transistors of the differential signal processing circuit 2 are operated in the nonsaturation region, and the output amplitude becomes small, the switching circuit can be operated at a high speed.

In this embodiment, buffering is done using two stages of CMOS inverters. However, the number of stages of CMOS inverters may be increased or the size of FET in the inverter may be changed in accordance with a desired drive capability. As the inverter, not only the CMOS inverter but also a bipolar or BiCMOS inverter may be used. As the CMOS inverters 76 and 78 or 77 and 79, transistors equal in size and layout are preferably used. With this arrangement, the delays or waveforms of the output signals 66 and 67 are almost equal, and any shift in complementarity between image signals decreases. For this reason, the reproducibility of light output pulse width of a light emitting element 15 for the image signals is not degraded. As in the first embodiment, even when noise on the semiconductor substrate or mounting substrate is superposed on the image signals, the influence of noise decreases. In addition, when the differential signal processing circuit, switching circuit, and buffer circuit are integrated on the semiconductor substrate, parasitic elements derived from the mounting substrate or individual components can be reduced, and higher-speed operation can be performed.

Figure 11:
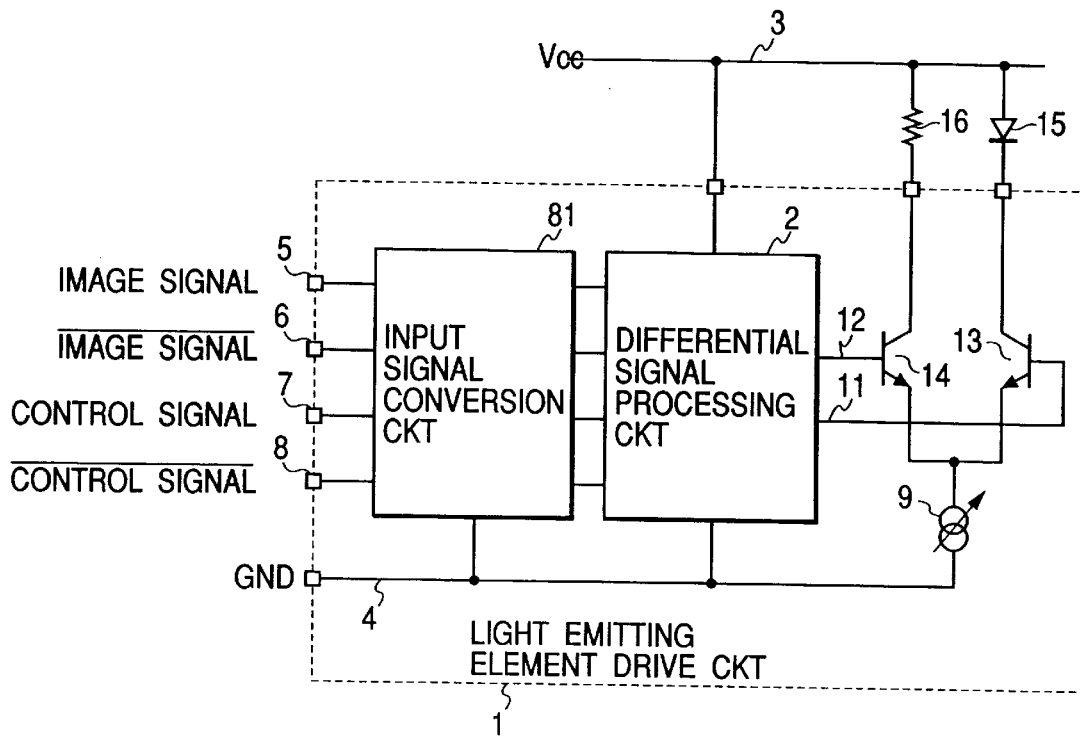
FIG. 11 is a block diagram showing the third embodiment of the present invention.

FIG. 11 is a block diagram showing the third embodiment of the present invention. An input signal conversion circuit 81 for converting the DC levels or amplitudes of one or both of image signals 5 and 6 or control signals 7 and 8 in accordance with the input range of a differential signal processing circuit 2 is arranged on the input side of the differential signal processing circuit 2. The arrangement of the remaining portions is the same as in FIG. 5. In the differential signal processing circuit 2 shown in FIG. 6, unless the image signals 5 and 6 or control signals 7 and 8 have different DC levels, the transistors in the processing circuit cannot operate in the nonsaturation region. In this embodiment, the DC level and/or the amplitude of the image signal or control signal is converted by the input signal conversion circuit 81 in accordance with the input range of the differential signal processing circuit 2, thereby reliably operating the transistors in the differential signal processing circuit 2 in the nonsaturation region.

Figure 12A:
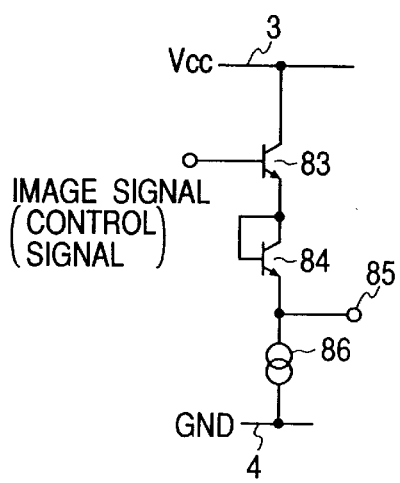
FIGS. 12A and 12B are circuit diagrams showing a specific example of an input signal conversion circuit of the embodiment shown in FIG. 11.
Figure 12B:
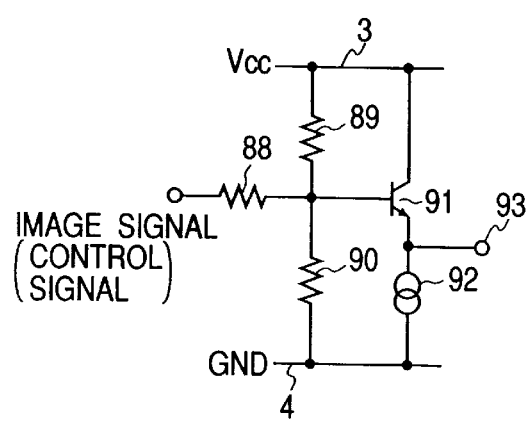

FIGS. 12A and 12B show a specific example of the input signal conversion circuit 81. FIG. 12A shows an emitter follower circuit comprising a transistor 83, a C-B short transistor 84, and a constant current source 86 (the circuit outputs an output 85). This circuit can shift the DC level of an image signal (or a control signal) to the ground potential side by only 2 $V_{BE}$ ($V_{BE}$ is the base-emitter voltage of the transistor). The circuit shown in FIG. 12B comprises resistors 88 to 90, a transistor 91, and a constant current source 92. This circuit can shift the DC level and also convert the amplitude.

This will be described in more detail. For example, when the circuit for outputting an image signal or a control signal is constituted by CMOS transistors, the high level corresponds to the power supply voltage, and the low level corresponds to the ground voltage. Assuming the resistance value ratio of the resistors 88 to 90 is 1:0.75:1, a voltage of about 0.54 $V_{CC}$ as high level or 0.4 $V_{CC}$ as low level appears at the base terminal of the transistor 91, neglecting the base current of the transistor 91. An output 93 buffered by the emitter follower is high level: 0.54 $V_{CC}-V_{BE}$ low level: 0.4 $V_{CC}-V_{BE}$ When $V_{CC}$=5 V, the amplitude of the output 93 is approximately 700 mV (0.14 $V_{CC}$), and the amplitude of the image signal or control signal can be converted.

As described above, in this embodiment, the DC levels or amplitudes of the complementary image signals 5 and 6 or complementary control signals 7 and 8 are converted in accordance with the input range of the differential signal processing circuit 2. With this arrangement, even when an image signal or control signal outside the input range of the differential signal processing circuit 2 is supplied, any shift in complementarity between the image signals can be minimized, and satisfactory reproducibility of light output pulse width of a light emitting element 15 can be obtained.

The input range of the differential signal processing circuit 2 cannot be made wide because the transistors in the circuit must be operated in the nonsaturation region. In this embodiment, the input signal conversion circuit 81 is inserted to convert the amplitude of an image signal or control signal. With this arrangement, the image signal or control signal can be transmitted from the image controller (not shown) for outputting the image signal or the sequence controller (not shown) for outputting the control signal to a light emitting element drive circuit 1 as a signal having a large logic amplitude such as a CMOS level. Consequently, the influence of noise can be decreased. In addition, when the differential signal processing circuit, switching circuit, and input signal conversion circuit are integrated on a semiconductor substrate, parasitic elements derived from the mounting substrate or individual components can be reduced, and higher-speed operation can be performed.

As has been described above, according to the present invention, logic signal operation of complementary image signals and at least one control signal is performed without converting them into a single signal, and the switching circuit for supplying a drive current to the light emitting element is driven by output complementary signals. With this arrangement, any shift in complementarity between drive pulses in the switching circuit can be decreased, and the operation speed can be increased. In addition, a drive circuit less influenced by noise than the conventional apparatus for processing a single image signal even when noise on the semiconductor substrate or mounting substrate is superposed on the signals can be realized.

What is claimed is:

1. A light emitting element drive apparatus comprising:

a differential signal processing circuit for performing logic processing of input complementary image signals that are 180° out of phase and at least one control signal using a differential circuit while maintaining the complementarity of signals to generate complementary output signals; and a switching circuit driven by the complementary output signals to supply a drive current to a light emitting element.

2. An apparatus according to claim 1, wherein said differential signal processing circuit outputs an OR and NOR or an AND and NAND of the image signal and control signal.

3. An apparatus according to claim 1, further comprising amplification means, inserted between said differential signal processing circuit and said switching circuit, for amplifying the outputs from said differential signal processing circuit.

4. An apparatus according to claim 3, wherein said differential signal processing circuit, said switching circuit, and said amplification means are integrated on a semiconductor substrate.

5. An apparatus according to claim 1, further comprising conversion means, arranged on an input side of said differential signal processing circuit, for converting at least one of a DC level and/or an amplitude of the image signal or the control signal in accordance with an input range of said differential signal processing circuit.

6. An apparatus according to claim 5, wherein said differential signal processing circuit, said switching circuit, and said conversion means are integrated on a semiconductor substrate.

7. An apparatus according to claim 1, wherein said differential signal processing circuit and said switching circuit are integrated on a semiconductor substrate.

8. An apparatus according to claim 1, wherein said light emitting element drive apparatus is used for an image forming apparatus.

* * * * *